(12) United States Patent
Andreev et al.

(10) Patent No.: US 7,062,726 B2
(45) Date of Patent: Jun. 13, 2006

(54) METHOD FOR GENERATING TECH-LIBRARY FOR LOGIC FUNCTION

(75) Inventors: Alexander E. Andreev, San Jose, CA (US); Igor A. Vikhliantsev, Sunnyvale, CA (US); Anatoli A. Bolotov, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 420 days.

(21) Appl. No.: 10/426,549

(22) Filed: Apr. 30, 2003

(65) Prior Publication Data

US 2004/0221247 A1    Nov. 4, 2004

(51) Int. Cl.
 *G06F 17/50* (2006.01)
(52) U.S. Cl. .................................. 716/1; 716/3; 716/18
(58) Field of Classification Search .................... 716/1, 716/3, 18
 See application file for complete search history.

(56) References Cited

U.S. PATENT DOCUMENTS

| | | | | |
|---|---|---|---|---|
| 4,703,435 A | * | 10/1987 | Darringer et al. | 716/18 |
| 5,359,537 A | * | 10/1994 | Saucier et al. | 716/18 |
| 5,461,574 A | * | 10/1995 | Matsunaga et al. | 716/2 |
| 5,537,330 A | * | 7/1996 | Damiano et al. | 716/18 |
| 5,841,647 A | * | 11/1998 | Hoshi | 363/56.12 |
| 6,038,381 A | * | 3/2000 | Munch et al. | 716/1 |
| 6,148,436 A | * | 11/2000 | Wohl | 716/18 |
| 6,721,926 B1 | * | 4/2004 | Wang et al. | 716/2 |
| 6,735,744 B1 | * | 5/2004 | Raghunathan et al. | 716/4 |
| 6,782,511 B1 | * | 8/2004 | Frank et al. | 716/1 |

* cited by examiner

*Primary Examiner*—Vuthe Siek
*Assistant Examiner*—Naum B. Levin
(74) *Attorney, Agent, or Firm*—Suiter West Swantz PC LLO

(57) ABSTRACT

The present invention is directed to a method for generating a tech-library for a logic function. A logic function has many representations. For each representation, a circuit for realizing the representation is decomposed into a combination of instances. An instance is a component logic circuit of a general logic circuit. There are pre-created tech-libraries for the instances. For example, a pre-created tech-library is created by categorizing tech-descriptions for primitive physical circuits based on a negation index. Thus, tech-descriptions for a circuit for realizing a representation are calculated from a combination of elements of the pre-created tech-libraries. Each calculated tech-description is compared with each existing element of a tech-library for the logic function. When a calculated tech-description has at least one marked parameter better or smaller than that of all existing elements of the tech-library for the logic function, the calculated tech-description is added to the tech-library. When the number of elements in the tech-library is at least twice larger than a limit, the number is reduced.

24 Claims, 11 Drawing Sheets

METHOD FOR GENERATING TECH-LIBRARY FOR LOGIC FUNCTION

FIELD OF THE INVENTION

The present invention generally relates to the field of integrated circuit design, and particularly to a method for generating a tech-library for a logic function.

BACKGROUND OF THE INVENTION

Modern design of integrated circuits (ICs) is a highly structured process based on an HDL (Hardware Description Language) methodology. FIG. 1 illustrates a simplified exemplary flowchart representation of an IC design cycle. First, in step 102 the IC to be designed is specified by a specification document.

Then, the IC design is reduced to an HDL code in step 104. This level of design abstraction is referred to as the Registered Transfer Level (RTL), and is typically implemented using a HDL language such as Verilog-HDL ("Verilog") or VHDL. At the RTL level of abstraction, the IC design is specified by describing the operations that are performed on data as it flows between circuit inputs, outputs, and clocked registers. The RTL level description is referred to as the RTL code, which is generally written in Verilog or in VHDL.

Next, in step 106 the IC design, as expressed by the RTL code, is synthesized to generate a gate-level description, or a netlist. Synthesis is the step taken to translate the architectural and functional descriptions of the design, represented by RTL code, to a lower level of representation of the design such as a logic-level and gate-level descriptions. The IC design specification and the RTL code are technology independent. That is, the specification and the RTL code do not specify the exact gates or logic devices to be used to implement the design. However, the gate-level description of the IC design is technology dependent. This is because, during the synthesis process, the synthesis tool uses a given technology library 108 to map the technology independent RTL code into technology dependent gate-level netlists.

After the synthesis of the design, the gate-level netlist is verified in step 110, the layout of the circuits is determined and tested in step 112, and the IC is fabricated in step 114.

In the synthesis step 106, logic functions described in a RTL code are mapped to physical circuits using the technology cells in the technology library 108. The technology library 108 may include many different technology cells (or physical circuits) to realize a single logic function. For example, the technology library 108 may include many different technology cells to realize the function of a 2-input AND.

Each logic function may be realized by many different combinations of technology cells. For example, a logic function MUX(Z,S,A,B) may be represented as Z=(~S & A)+(S & B), where~ represents NOT, & represents AND, and + represents OR. This representation is a combination of 4 logic functions: 1 NOT, 2 ANDs, and 1 OR. Each of the 4 logic functions may be realized by many different technology cells in the technology library 108. Thus, there are a large number of combinations of technology cells to realize the representation Z=(~S & A)+(S & B). The logic function MUX(Z,S,A,B) has other representations. For example, the logic function MUX(Z,S,A,B) may be represented as Z=(~S & A)+(~S & ~B). This representation contains 6 logic functions: 3 NOTs, 2 ANDs, and 1 OR. Each of the 6 logic functions may be realized by many technology cells in the technology library 108. Thus, there are a large number of combinations of technology cells to realize the representation Z=(~S & A)+(~S & ~B). Therefore, the total number of physical circuits which realize the logic function MUX(Z, S,A,B) may be very large.

Each physical circuit has a number of parameters such as area, delay, load and the like. The set of parameters that describes a physical circuit is defined as a tech-description of the physical circuit. Tech-descriptions of physical circuits for realizing a logic function are defined as a tech-library of the logic function.

In the mapping process, certain physical circuits for realizing a logic function may be preferred because of the goal of the IC design. For example, if the goal is to reduce the area of the physical circuit, the physical circuit optimized over the area may be chosen.

However, since the technology library generally does not include physical circuits optimized over one or more parameters for realizing a randomly defined logic function, the IC designer often spends large amount of time on choosing an appropriate physical circuit to which the logic function is actually mapped. This may result in unacceptable delay in runtime of the mapping process.

Therefore, it is desirable to provide a method for generating a tech-library for a logic function, which tech-library contains tech-descriptions for physical circuits optimized over one or more parameters to realize the logic function.

SUMMARY OF THE INVENTION

Accordingly, the present invention is directed to a method for generating a tech-library for a logic function. A logic function has many representations. For each representation, a logic circuit for realizing the representation is decomposed into a combination of instances. An instance is a component logic circuit of a general logic circuit. There are pre-created tech-libraries for the instances. For example, a pre-created tech-library is created by categorizing tech-descriptions for primitive physical circuits based on a negation index. Thus, tech-descriptions for a circuit for realizing a representation are calculated from a combination of elements of the pre-created tech-libraries. Each calculated tech-description is compared with each existing element of a tech-library for the logic function. When a calculated tech-description has at least one marked parameter better or smaller than that of all existing elements of the tech-library for the logic function, the calculated tech-description is added to the tech-library. When the number of elements in the tech-library is at least twice larger than a limit, the number is reduced.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
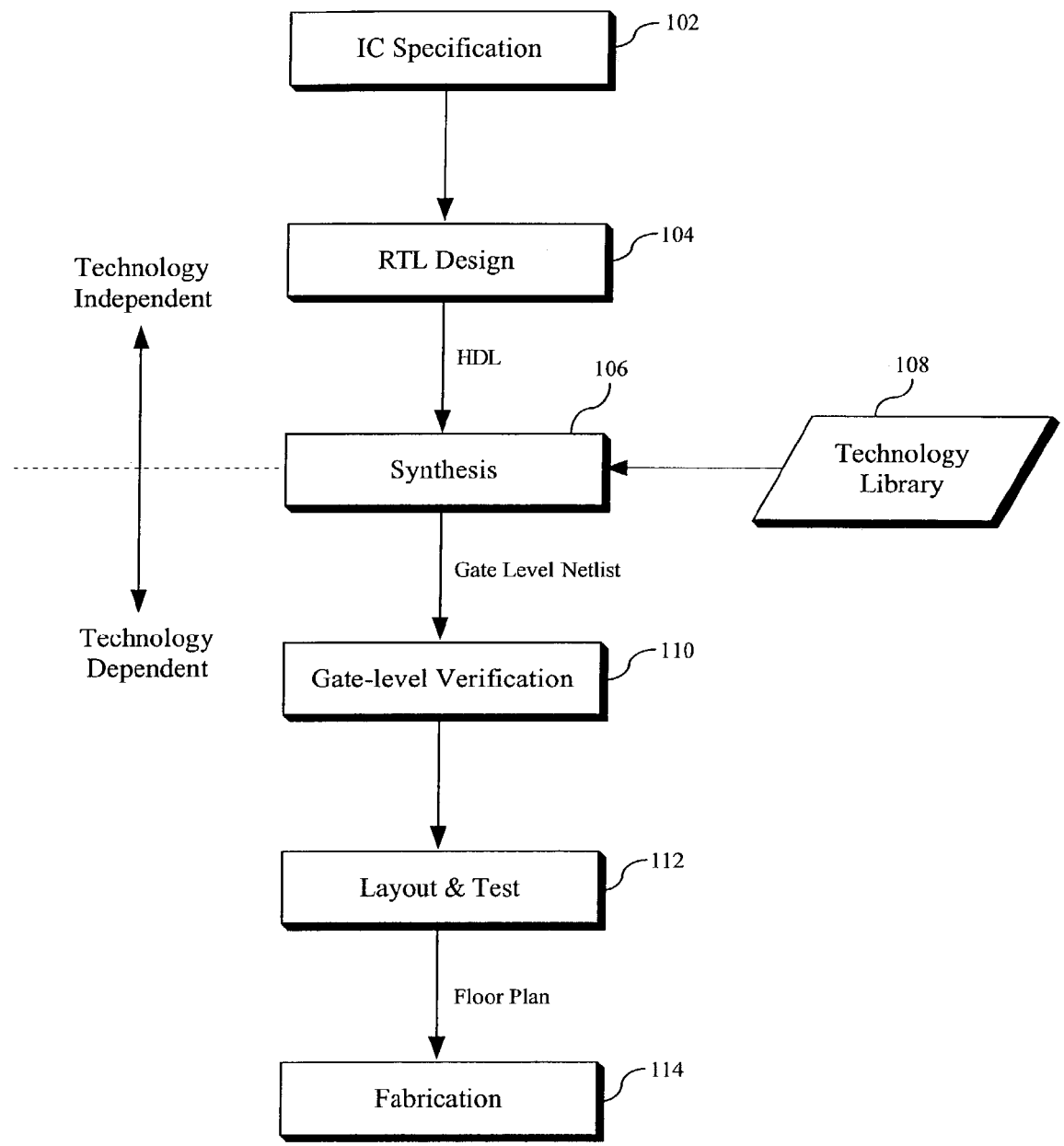
FIG. 1 illustrates a simplified exemplary flowchart representation of an IC design cycle.

Reference will now be made in detail to the presently preferred embodiments of the invention, examples of which are illustrated in the accompanying drawings.

In a synthesis step of a typical IC design process, logic functions described in a RTL code are mapped to physical circuits using the technology library. Each logic function may be realized by many different physical circuits. Each physical circuit has a number of parameters such as area, delay, load and the like. The set of parameters that describes a physical circuit is defined as a tech-description of the physical circuit. Tech-descriptions of physical circuits for realizing a logic function are defined as a tech-library of the logic function.

In the mapping process, certain implementations, i.e., certain physical circuits for realizing a logic function, may be preferred because of the goal of the IC design. However, since the technology library generally does not include physical circuits optimized over one or more parameters for realizing a randomly defined logic function, the IC designer often spends large amount of time on choosing an appropriate physical circuit to which the logic function is actually mapped. This may result in unacceptable runtime in the mapping process.

One purpose of this invention is to provide a method and apparatus for generating a tech-library for a logic function, which tech-library contains tech-descriptions for physical circuits optimized over one or more parameters to realize the logic function.

The use of the tech-library created according to the present invention may facilitate the mapping process of a logic function. For example, if the goal is to reduce the area of the physical circuit, the physical circuit optimized over the area may be simply chosen from the tech-library. If the circuit delay need be reduced, the optimal physical circuit with combined optimization (depending on the physical circuit) with respect to the iterated delay, the optimal delay over each circuit (arc-input-output), and the minimum input load may be simply chosen from the tech-library Similarly, the physical circuit with optimized critical paths or the port loads may be simply chosen from the tech-library.

Definitions

Negation Index

The present invention introduces a notation of a negation index for generating a tech-library for a randomly defined logic function. The concept of a negation index will be described below in some examples.

First, consider a logic function XOR that has two inputs A, B and one output Z, and is represented as $Z=A \oplus B$ (mod 2), where $\oplus$ represents exclusive OR. Since redistribution of negations in a logic function is a simplest way of implementing the equivalent logic function, negation of ports may be performed at each of the input and output ports of the logic function XOR as follows:

If no negation is applied to any ports, then $Z_0 = A \oplus B$.

If a negation is applied to the input port A, that is, if A is changed to ${\sim}A$, then $Z_1 = ({\sim}A) \oplus B = A \oplus B \oplus 1$.

If a negation is applied to the input port B, that is, if ${\sim}B$ is changed to ${\sim}B$, then $Z_2 = A \oplus ({\sim}B) = A \oplus B \oplus 1$.

If negations are applied to the input ports A and B, that is, if A is changed to ${\sim}A$, and B is changed to ${\sim}B$, then $Z_3 = ({\sim}A) \oplus ({\sim}B) = A \oplus B$.

If a negation is applied to the output port Z, that is, if Z is changed to ${\sim}Z$, then $Z_4 = {\sim}Z = {\sim}(A \oplus B) = A \oplus B \oplus 1$.

If negations are applied to the input port A and the output port Z, that is, if A is changed to ${\sim}A$, and Z is changed to ${\sim}Z$, then $Z_5 = {\sim}({\sim}A \oplus B) = A \oplus B$.

If negations are applied to the input port B and the output port Z, that is, if B is changed to ${\sim}B$, and Z is changed to ${\sim}Z$, then $Z_6 = {\sim}(A \oplus {\sim}B) = A \oplus B$.

Finally, if negations are applied to the input ports A, B and the output port Z, that is, if A is changed to ${\sim}A$, B is changed to ${\sim}B$, and Z is changed to ${\sim}Z$, then $Z_6 = {\sim}({\sim}A \oplus {\sim}B) = A \oplus B \oplus 1$.

As shown from above, not every combination of negation of ports results in the original function. For example, although Z3, Z5 and Z6 realize the original function $Z=A \oplus B$, Z1, Z2, Z4, and Z4 each realize a different function $Z=A \oplus B \oplus 1$.

In order to enumerate the different functions realized when the input port and output port are negated, a notation of negation index NI ({output, $input_n$, ..., $input_1$}, logic function) may be introduced, where {output, $input_n$, ..., $input_1$} indicates the negation status of the input and output ports with 0 representing no negation for the port and 1 representing a negation for the port. The negation index for the original function is always 0. For the logic function XOR, the negation indices are shown as follows:

NI({0,0,0}, XOR)=0 where {0,0,0} means no negations for the XOR;

NI({0,0,1}, XOR)=1, where {0,0,1} means negation for the first input A;

NI({0,1,0}, XOR)=1, where {0,1,0} corresponds Z, ${\sim}B$(negation of B), A;

NI({0,1,1}, XOR)=0, where {0,1,1} corresponds Z, ${\sim}B$, ${\sim}A$;

NI({1,0,0}, XOR)=1, where {1,0,0} corresponds ${\sim}Z$, B, A;

NI({1,0,1}, XOR)=0, where {1,0,1} corresponds ~Z, B, ~A;

NI({1,1,0}, XOR)=0, where {1,1,0} corresponds ~Z, ~B, A;

NI({1,1,1}, XOR)=1, where {1,1,1} corresponds ~Z, ~B, ~A;

Thus, there are only two negation indices for the logic function XOR: 0 and 1. The tech-library XOR_0 (0 represents the negation index) realizes the function Z=A⊕B, and the tech-library XOR_1 (1 represents the negation index) realizes a different function Z=A⊕B⊕1.

Now, consider a logic function AND (Z=A & B), which has two inputs A, B and one output Z.

Because a different combination of negations on the input and output ports of the logic function AND results in a different logic function, there are 8 negation indices for the logic function AND: 0 through 7. Thus, the 8 tech-libraries corresponding to the logic function AND may be shown as follows:

AND_0, wherein 0 represents the negation index, realizes Z=A & B;
AND_1, wherein 1 represents the negation index, realizes Z=(~A) & B;
AND_2, wherein 2 represents the negation index, realizes Z=A & (~B);
AND_3, wherein 3 represents the negation index, realizes Z=(~A) & (~B);
AND_4, wherein 4 represents the negation index, realizes Z=~(A & B);
AND_5, wherein 5 represents the negation index, realizes Z=~(~A & B);
AND_6, wherein 6 represents the negation index, realizes Z=~(A & ~B);
AND_7, wherein 7 represents the negation index, realizes Z=~(~A & ~B).

Each tech-library is for the logic function AND with a corresponding negation index. For example, the tech-library AND_6 is for the logic function AND with a negation index of 6.

It is understood that a 2-input XOR and a 2-input AND are used only as examples to illustrate the concept of a negation index. It is appreciated that a negation index is applicable to any logic function, including a 3-input AND, and the like.

Those of ordinary skill in the art will understand that the logic function MUX(Z,S,A,B) has 8 negation indices.

Cell Delay

Figure 2:
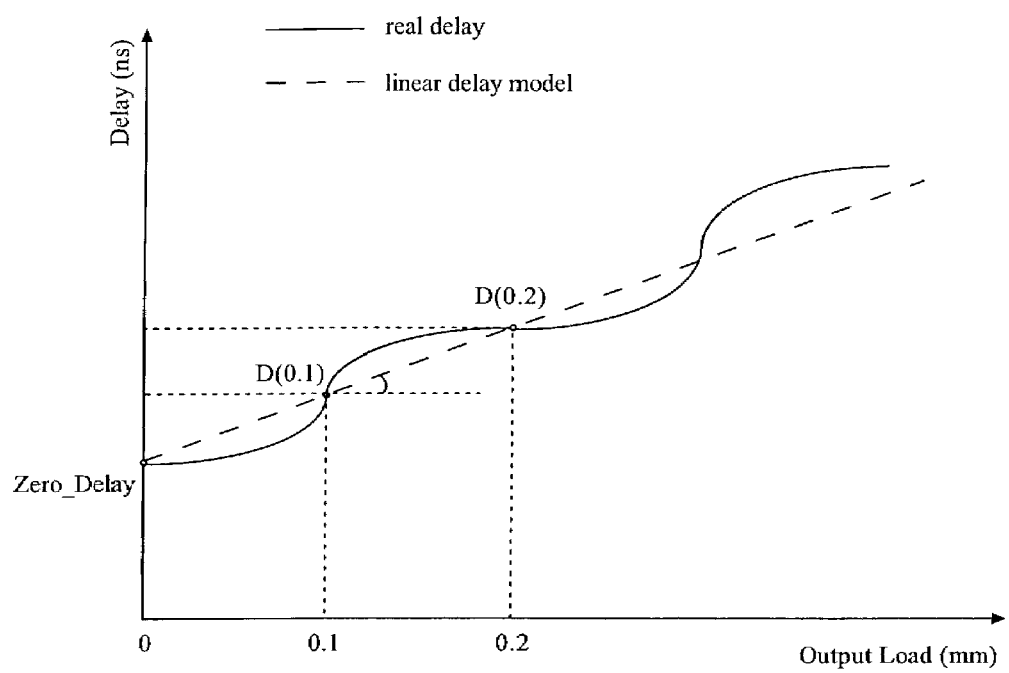
FIG. 2 illustrates an exemplary delay versus output load graph used in an exemplary embodiment of the present invention.

Cell delay is the signal propagation delay through a physical circuit. Cell delay may be modeled as a linear function of output load for a fixed input ramptime (0.05), as shown in FIG. 2:

Delay=$D$(Output_Load)=Zero_Delay+$k$*Output_Load where k is the slope of the linear broken line representing the linear delay model. As shown in FIG. 2, Zero_Delay and k may be obtained as follows:

Zero_Delay=2*($D$(0.2)−$D$(0.1)), $k$=10*($D$(0.2)−$D$(0.1)), where 0.1 (mm) is a load (capacity) of a standard wire with a length of 0.1 mm.

The cell delays may also be represented using non-linear delay models which are essentially look-up tables. Typically, a group of tables are supplied in the technology library for each physical circuit. Tables are designated for representing the rise and fall delays for each timing arc of the physical circuit. Look-up tables for delays may be created, for example, based on experiments with a LSI internal delay calculation tool called Isidelay.

Arc

An arc for a given physical circuit is a pair (a,z) of input port a and output port z if the path between the given ports a and z exists.

Iterated Delay of Arc (a,z)

Figure 3:
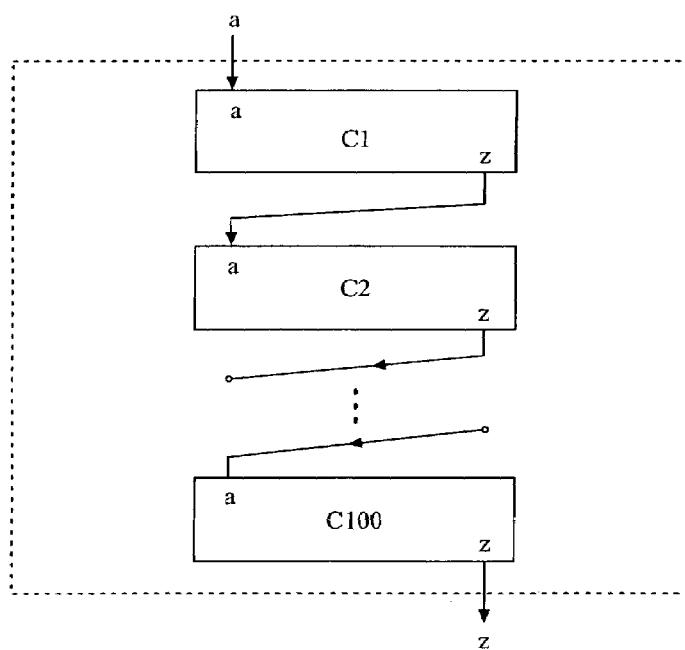
FIG. 3 illustrates iterated delay of arc for a given circuit.

As shown in FIG. 3, an iterated delay of arc (a,z) for a given physical circuit C is a delay of path between ports a and z in the circuit that consists of 100 circuits C, where the output z of ith-circuit connected to the input a of (i+1)th-circuit (suppose the length of each circuit C is equal to 0.1 mm), the input a of the first circuit is the input port a for the whole circuit, and the output z of 100-th circuit is the output port z for the whole circuit.

Maximal Delay

Maximal delay of a technology cell is a maximum delay of all arcs for a maximal output load, e.g., a 5 mm load.

Tech-description

A tech-description for a physical circuit is a set of parameters describing the physical circuit, including input loads, an area occupied by the physical circuit (as well as a height of the physical circuit in grids), a maximal delay, the number of arcs, Zero_Delay (i.e., delay for zero output load), k, iterated delay for every arc, and the like.

A tech-description may have its parameter marked as a j-th marked parameter (j≧0). For example, a 0-th marked parameter may be an area occupied by the physical circuit, a 1-th marked parameter may be iterated delay for every arc, and a 2-th marked parameter may be a maximum delay.

Tech-library

A tech-library for a given logic function is a set of tech-descriptions for different physical circuits realizing this function. A logic function may have more than one representation. A representation is a formula expressing a logic function. Because the number of different physical circuits for realizing a logic function is large, the number of tech-descriptions in the tech-library may need to be reduced.

Categorizing Primitive Physical Circuits

Using negation indices, tech-descriptions for primitive technology cells (or physical circuits) in a technology library may be categorized into different tech-libraries. Primitive physical circuits are those physical circuits originally in a technology library (e.g., LSI library lcbg12p).

Figure 4:
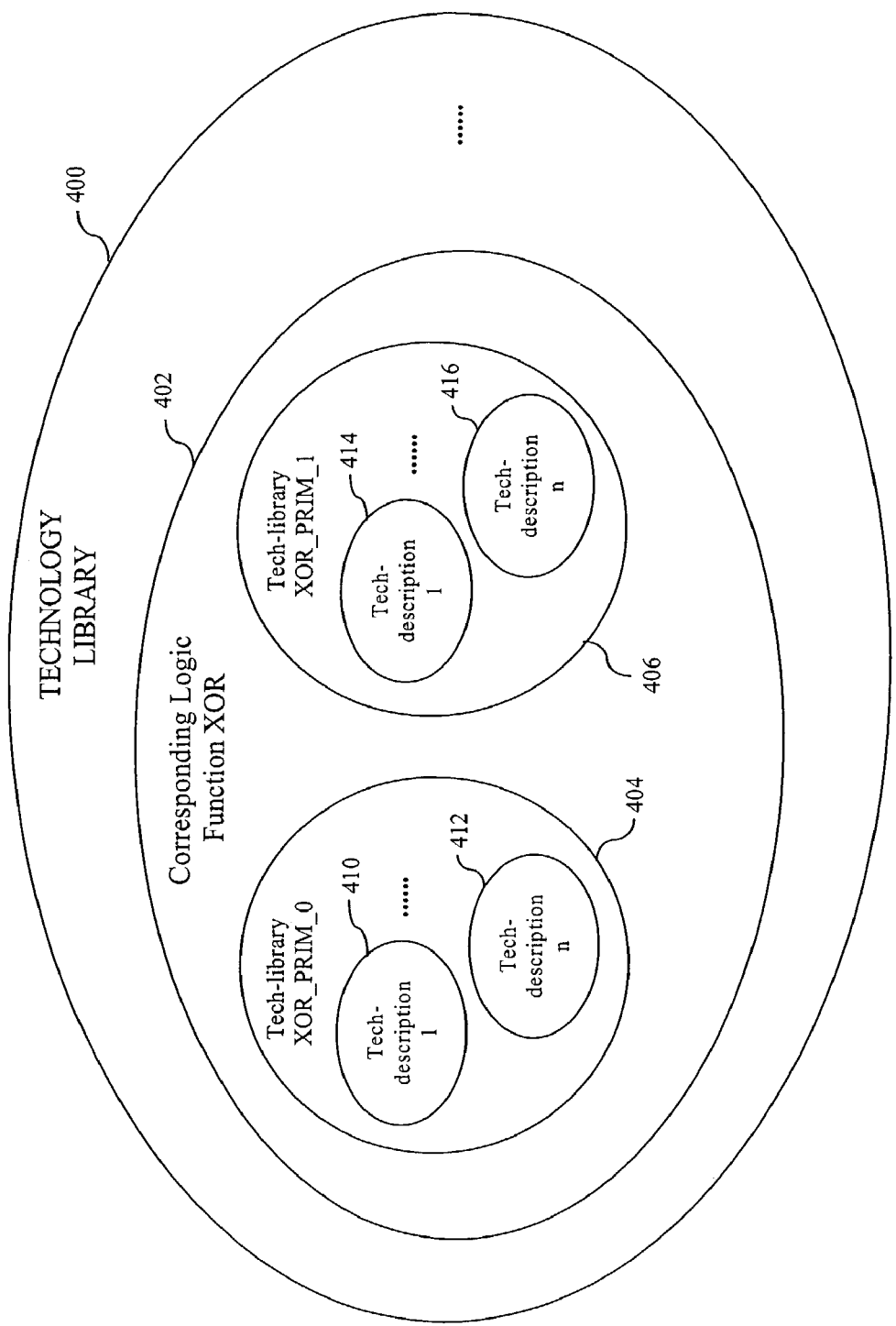
FIG. 4 depicts an exemplary relationship among a technology library, a logic function, tech-libraries for the logic function with corresponding negation indices in accordance with the present invention.

As shown in FIG. 4, a logic function XOR 402 within a technology library 400 may have two corresponding tech-libraries for primitive physical circuits: a XOR_PRIM_0 ("0" represents a negation index 0) 404 for realizing a function Z=A⊕B, and a XOR_PRIM_1 ("1" represents a negation index 1) 406 for realizing a function Z=A⊕B⊕1. The XOR_PRIM_0 404 may include tech-description 1 410, . . . , and tech-description n 412. For example, if the technology library 400 is LSI library lcbg12p, then the tech-library XOR_PRIM_0 404 may include 10 tech-descriptions, each description for a different primitive physical circuit in the LSI library lcbg12p: EOAFP(A,B), EOAFP(B,A), EOBFP(A,B), EOBFP(B,A), EOCFP(A,B), EOCFP(B,A), EODFP(A,B), EODFP(B,A), EOLFP(A,B), and EOLFP(B,A). The XOR_PRIM_1 406 may include tech-description 1 414, . . . , and tech-description n 416. For example, if the technology library 400 is LSI library lcbg12p, then the tech-library XOR_PRIM_1 406 may include 10 tech-descriptions, each description for a different primitive physical circuit in the LSI library lcbg12p: ENAFP (A,B), ENAFP(B,A), . . . , ENLFP(A,B), and ENLFP(B,A).

The technology library 400 shown in FIG. 4 may further include 8 tech-libraries (not shown in FIG. 4) corresponding to a logic function AND:

AND_PRIM_0 for realizing Z=A & B;
AND_PRIM_1 for realizing Z=(~A) & B;
AND_PRIM_2 for realizing Z=A & (~B);
AND_PRIM_3 for realizing Z=(~A) & (~B);
AND_PRIM_4 for realizing Z=~(A & B);
AND_PRIM_5 for realizing Z=~(~A & B);
AND_PRIM_6 for realizing Z=~(A & ~B);
AND_PRIM_7 for realizing Z=~(~A & ~B);

where the number is a negation index. Each of the 8 tech-libraries may include a set of tech-descriptions, each description for a primitive physical circuit in the technology library. For example, if the technology library 400 is LSI library lcbg12p, then the tech-library AND_PRIM_0 may include 10 tech-descriptions, each description for a different primitive physical circuit in the LSI library lcbg12p: AND2AFP(A,B), AND2AFP(B,A), . . . , AND2LFP(A,B), and AND2LFP(B,A).

Those of ordinary skill in the art will understand that other primitive physical circuits in the technology library 400 may be categorized into other tech-libraries without departing from the scope and spirit of the present invention.

Random Logic Function F

Generating Tech-descriptions

According to the present invention, a logic circuit for realizing a randomly defined logic function may be decomposed into a combination of instances. An instance is a component logic circuit of a general logic circuit. When there is a pre-created tech-library for each of the instances, then tech-descriptions for the randomly defined logic function may be calculated from a combination of elements (tech-descriptions) from the pre-created tech-libraries.

Figure 5:
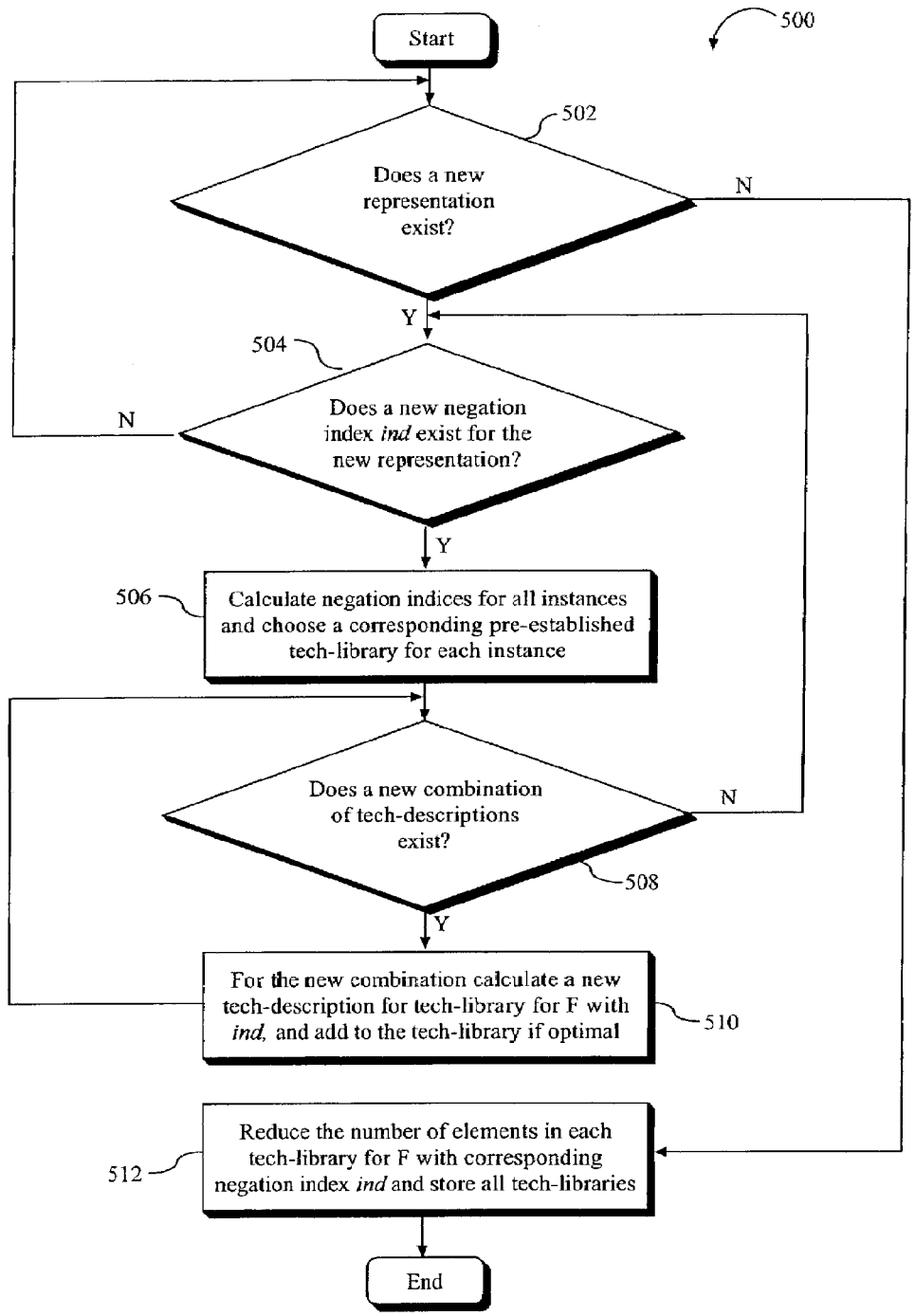
FIG. 5 is an exemplary process for generating tech-descriptions for a randomly defined logic function in accordance with the present invention.

Referring now to FIG. 5, an exemplary process 500 for generating tech-descriptions for a randomly defined logic function F in accordance with the present invention is illustrated. The process starts with step 502 in which an inquiry whether there is a new representation for F is held. F may have more than one representation. A representation is a formula expressing a logic function. It is appreciated that a new representation here means a representation that on which next steps (i.e., steps 504, 506, 508, and 510) have not been performed.

Figure 6C:
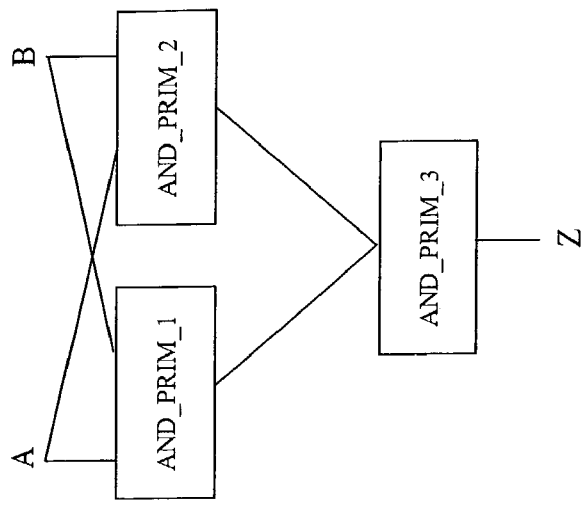
FIGS. 6A, 6B and 6C show three exemplary representations of a randomly defined logic function $Z=A \oplus B$ in accordance with the present invention.
Figure 6B:
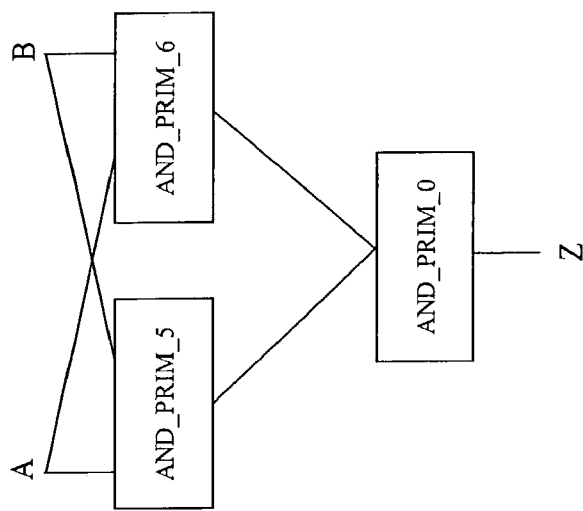
Figure 6A:
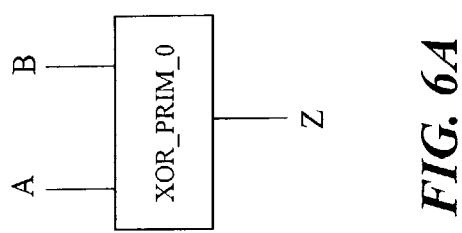

For example, F may be a logic function Z=A⊕B, which may have three different representations as follows:

(1) Representation #1: Z=A⊕B=X(A,B), where X corresponds to the tech-library XOR_PRIM_0, as shown in FIG. 6A;

(2) Representation #2: Z=A⊕B=(A+(~B)) & ((~A)+B)= (~(~A & B)) & (~(A & ~B))=$g_1$ & $g_2$=g($g_1$,$g_2$), where $g_1$=~(~A & B) corresponds to the tech-library AND_PRIM_5, $g_2$=~(A & ~B) corresponds to the tech-library AND_PRIM_6, and g=A & B corresponds to the tech-library AND_PRIM_0, as shown in FIG. 6B; and (3) Representation #3: Z=A⊕B=(~(~A & B)) & (~(A & (~B))=~$f_1$ & ~$f_2$=f($f_1$, $f_2$), where $f_1$=~A & B corresponds to the tech-library AND_PRIM_1, $f_2$=A & (~B) corresponds to the tech-library AND_PRIM_2, and f=~A & ~B corresponds to the tech-library AND_PRIM_3, as shown in FIG. 6C.

Different representations for F may be obtained by redistributing negations in inputs and outputs. For example, F may be a randomly defined logic function Z=(A & B)+(C & ~D), which has four input ports A, B, C, D and one output port Z. F thus may be realized in a logic circuit shown in FIG. 7A. The function Z=(A & B)+(C & ~D) is functionally equal to Z=~(~Z), wherein ~Z=~((A & B)+(C & ~D))=~(A & B) & ~(C & D). Thus, the logic function Z=(A & B)+(C & ~D) may also be realized in logic circuits shown in FIG. 7B and FIG. 7C, which allow generation of tech-descriptions for the logic function Z=(A & B)+(C & ~D) using 8 pre-established tech-libraries for a logic function AND as follows:

AND_0 for realizing Z=A & B;
AND_1 for realizing Z=(~A) & B;
AND_2 for realizing Z=A & (~B);
AND_3 for realizing Z=(~A) & (~B);
AND_4 for realizing Z=~(A & B);
AND_5 for realizing Z=~(~A & B);
AND_6 for realizing Z=~(A & ~B);
AND_7 for realizing Z=~(~A & ~B);

where the number is a negation index. Each of the 8 tech-libraries includes a set of tech-descriptions, each description for a physical circuit. Note here the physical circuit may be a primitive physical circuit. However, this is not necessarily so. For example, the tech-library AND_3 may include tech-descriptions for primitive physical circuits and tech-descriptions for later added (non-primitive) physical circuits.

Figure 7C:
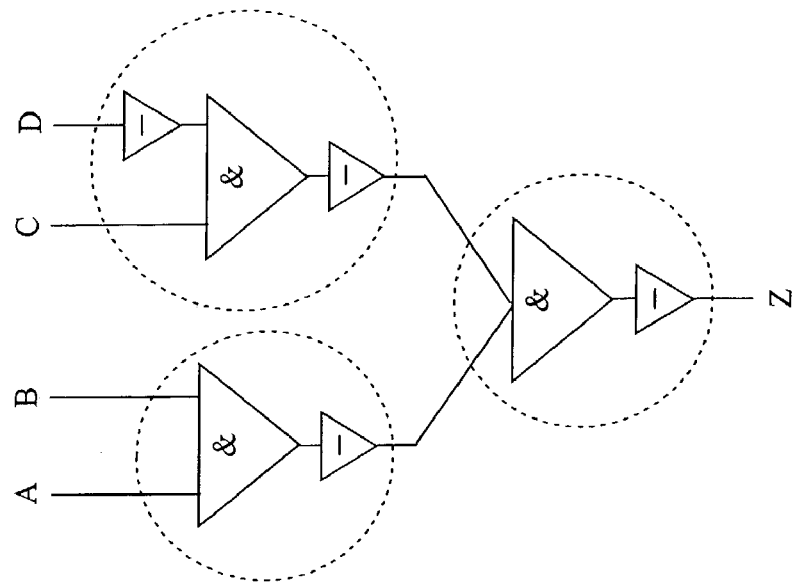
FIGS. 7A, 7B and 7C illustrate three exemplary representations of a randomly defined logic function $Z=(A \& B)+(C \& {\sim}D)$ in accordance with the present invention.
Figure 7B:
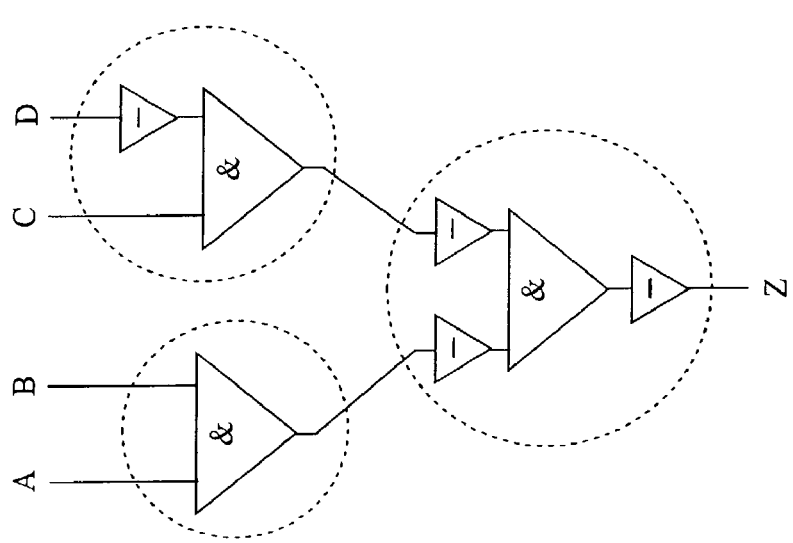
Figure 7A:
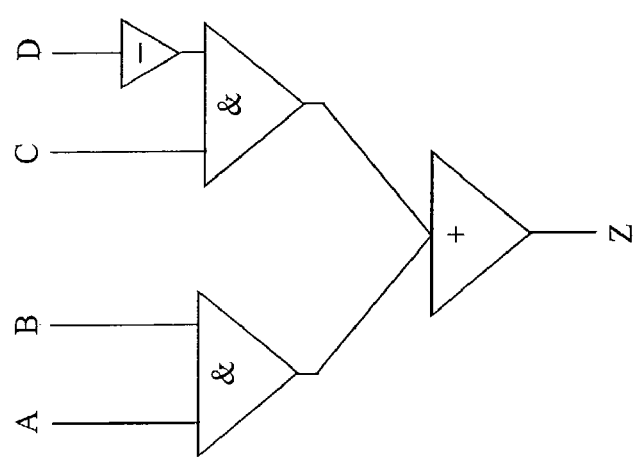
Figure 8B:
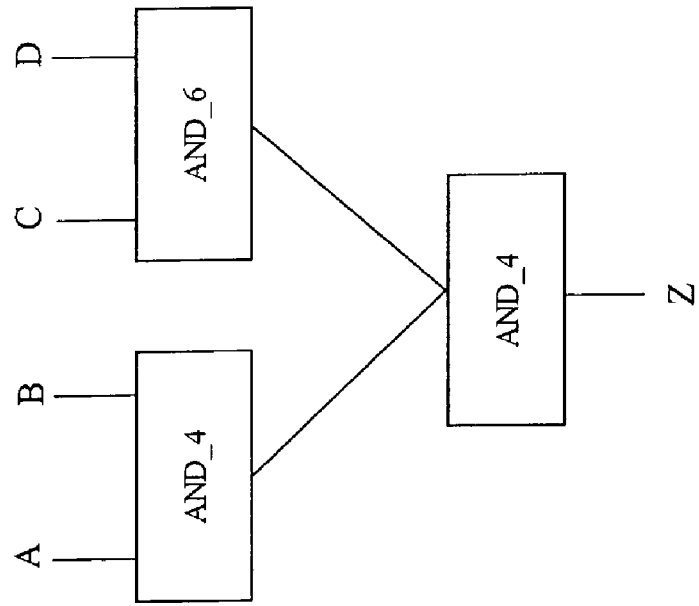
FIGS. 8A, 8B depicts exemplary logic circuits for realizing the representations shown in FIGS. 7B, 7C, respectively, in accordance with the present invention.
Figure 8A:
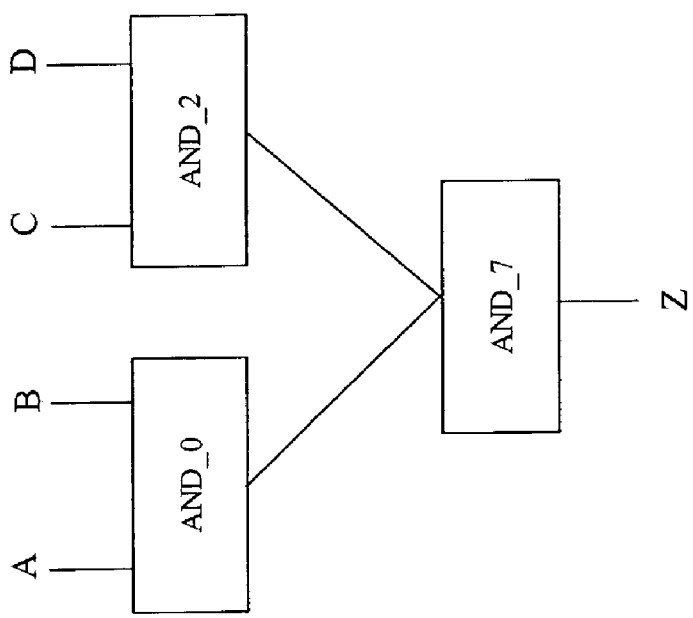

The above-described 8 tech-libraries for AND may be applied to FIG. 7B and FIG. 7C. The logic circuit shown in FIG. 7B may be described by a combination of 3 tech-libraries: one AND_0, one AND_2, and one AND_7, as shown in FIG. 8A. The logic circuit shown in FIG. 7C may be described by a combination of 3 tech-libraries: two AND_4, and one AND_6.

Now referring back to FIG. 5, if the answer to the inquiry of the step 502 is no, that is, the next steps (i.e., the steps 504, 506, 508, and 510) have been performed on all representations, the process 500 proceeds to step 512, in which the number of tech-descriptions in the tech-library for F with corresponding negation indices may be reduced. The step 512 will be described in detail along with FIG. 12.

If the answer to the inquiry of the step 502 is yes, that is, if there is a new representation on which the next steps (i.e., the steps 504, 506, 508, and 510) have not yet been performed, the process 500 proceeds to the step 504, in which an inquiry of whether there is a new negation index ind for the new representation is held. Here, ind may be "0".

If the answer to the inquiry of the step 504 is no, that is, if all negation indices for the new representation have been analyzed, then the process 500 returns to the step 502.

If the answer to the inquiry of the step 504 is yes, then the process 500 proceeds to the step 506, in which for the new representation with the new negation index ind, negation indices for all instances are calculated, and a corresponding pre-created tech-library for each instance is chosen. A pre-created tech-library may include tech-descriptions for primitive physical circuits only. For example, a pre-created tech-library may be the tech-library XOR_PRIM_0 or the tech-library XOR_PRIM_1 shown in FIG. 4. Alternatively, a pre-created tech-library may include tech-descriptions for non-primitive physical circuits.

Following the step 506, an inquiry of whether there is a new combination of tech-descriptions is held in step 508. It is noted that the new combination of tech-descriptions may be a first combination of tech-descriptions. If the answer is no, the process 500 returns to the step 504. If the answer is yes, the process proceeds to step 510, in which for the new combination, a new tech-description for the tech-library for F with ind may be calculated. The newly calculated tech-description may be added to the tech-library for F with ind in a process described below along with FIG. 11.

The exemplary process 500 may be explained using the logic function Z=A⊕B as an example. As described above, the logic function Z=A⊕B may have Representations #1, #2, and #3 shown in FIGS. 6A, 6B, and 6C, respectively.

The step 502 inquires whether there is a new representation. If none of the three Representations have gone through a negation analysis (shown in the steps 504, 506, 508, and 510), then Representation #1, #2, or #3 may be a new representation. If Representation #1 has gone through next steps (i.e., steps 504, 506, 508, and 510), then Representation #2 or #3 may be a new representation. If all three Representations have gone through next steps (i.e., steps 504, 506, 508, and 510), then there is no new representation, and the process 500 proceeds to the step 512.

Suppose Representation #2 is the new representation, then in the step 504, an inquiry of whether there is a new negation index ind for Representation #2 is held. The logic function Z=A⊕B has only two negation indices: 0 and 1. If Representation #2 has not gone through the steps 506, 508, and 510 for either negation index, then ind may be either 0 and 1. If Representation #2 has gone through the steps 506, 508, and 510 for the negation index 0, then ind may be 1. If Representation #2 has gone through the steps 506, 508, and 510 for both negation indices, then there is no new negation index for Representation #2, and the process 500 returns to the step 502.

Figures 9A, 9B, 9C:
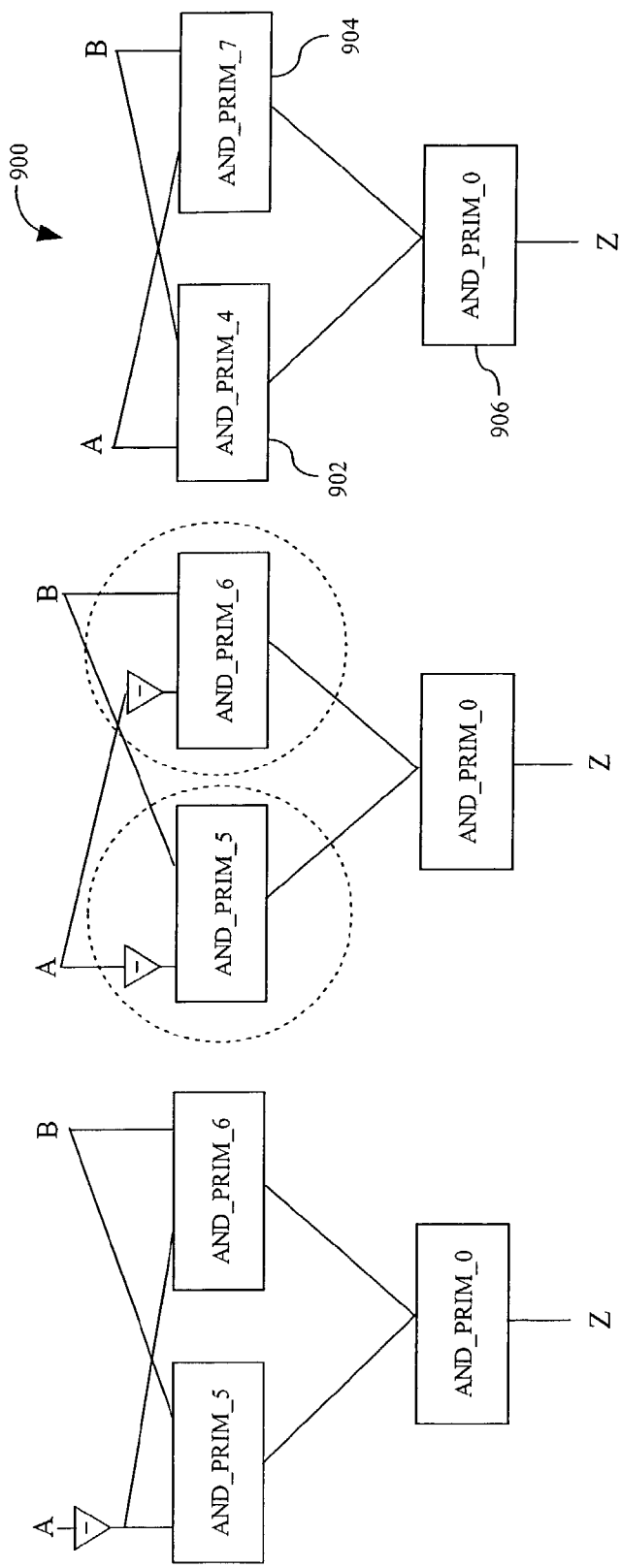
FIGS. 9A, 9B and 9C show exemplary equivalent logic circuits for realizing the representation shown in FIG. 6B with a negation index of 1 in accordance with the present invention.

Suppose the new negation index ind is 1, a logic circuit (shown in FIG. 9A) for Representation #2 with a negation index of 1 may be obtained by changing A to ~A in the logic circuit shown FIG. 6B. The logic circuit shown in FIG. 9A may be expressed as the logic circuit shown in FIG. 9B. In the step 506, negation indices for all instances of the logic circuit shown in FIG. 9B are calculated to obtain a logic circuit 900 shown in FIG. 9C. The logic circuit 900 has three instances: an instance with a negation index 4 (corresponding to a pre-established tech-library AND_PRIM_4 902), an instance with a negation index 7 (corresponding to a pre-established tech-library AND_PRIM_7 904), and an instance with a negation index 0 (corresponding to a pre-established tech-library AND_PRIM_0 906). A pre-established tech-library is a tech-library established before the current process 500 starts.

As described above, the tech-libraries AND_PRIM_4 902, AND_PRIM_7 904, and AND_PRIM_0 906 each include tech-descriptions for primitive physical circuits. A combination of a tech-description e1 from the tech-library AND_PRIM_4 902, a tech-description e2 from the tech-library AND_PRIM_7 904, a tech-description e3 from the tech-library AND_PRIM_0 906 thus defines a tech-description for the logic circuit shown in FIG. 9C. It is understood that pre-established tech-libraries including tech-descriptions for non-primitive physical circuits may be used to describe the three instances without departing from the scope and spirit of the present invention.

Next, in the step 508, the inquiry of whether there is a new combination of tech-descriptions is held. A combination of the tech-descriptions e1, e2 and e3 is new if a tech-description for the logic circuit 900 shown in FIG. 9C has not been calculated for the combination. If there is no new combinations of the tech-descriptions, then the process 500 returns to the step 504.

Figure 10:
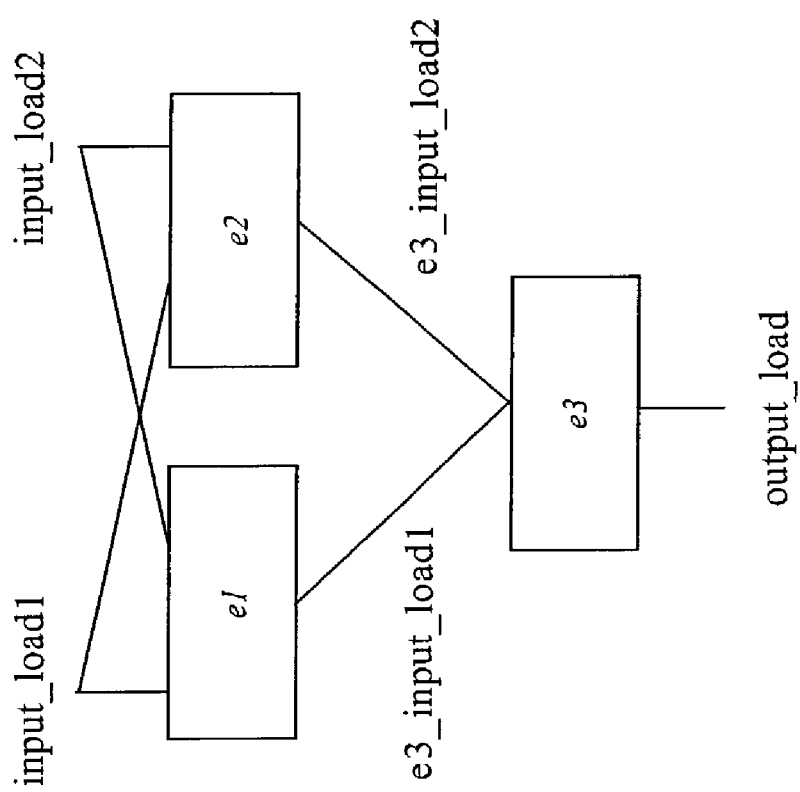
FIG. 10 illustrates an exemplary tech-description for the logic circuit shown in FIG. 9C calculated from a combination of tech-descriptions for instances.

Suppose the combination of the tech-descriptions e1, e2 and e3, as shown in FIG. 10, is new, then in the step 510 a tech-description e for the circuit 900 is calculated for the combination. For example, input_load1 for e=input_load1 for e1+input_load1 for e2;
input_load2 for e=input_load2 for e1+input_load2 for e2;
output_load for e=output_load for e3;
k for e=k for e3;
Zero_Delay for e=Max (Zero_Delay for e1+k for e1*input_load1 for e3,
    Zero_Delay for e2+k for e2*input_load2 for e3)

Suppose the tech-libraries AND_PRIM_4 902, AND_PRIM_7 904, and AND_PRIM_0 906 each include 100 tech-descriptions e1, e2 and e3, respectively, then there are 1,000,000 tech-descriptions e for the circuit 900. Of course, not every generated tech-description e is optimal. Only when e is optimal over one more parameters is e in the step 510 added into a tech-library for the logic function Z=A⊕B with a negation index of 1.

It is appreciated that the tech-library generated for the logic function Z=A⊕B with a negation index of 1 may be combined with the tech-library XOR_PRIM_1 406 shown in FIG. 4 to form a new library XOR_1. The new library XOR_1 thus includes tech-descriptions for primitive physical circuits (i.e., those original tech-descriptions in the tech-library XOR_PRIM_1 406) and tech-descriptions for non-primitive physical circuits (e.g., those tech-descriptions generated by the process 500).

It is noted that the logic function Z=A⊕B is used only as an example to explain the steps of the process 500 and is not intended to limit the scope and the spirit of the present invention. The process 500 may be performed on any randomly defined logic function. For example, as described above, representations of the randomly defined logic function Z=(A & B)+(C & ~D) are shown in FIGS. 8A and 8B. The process 500 may be performed on either representation to generate tech-libraries for the logic function Z=(A & B)+(C & ~D) with corresponding negation indices.

Adding Tech-descriptions to Tech-library

Figure 11:
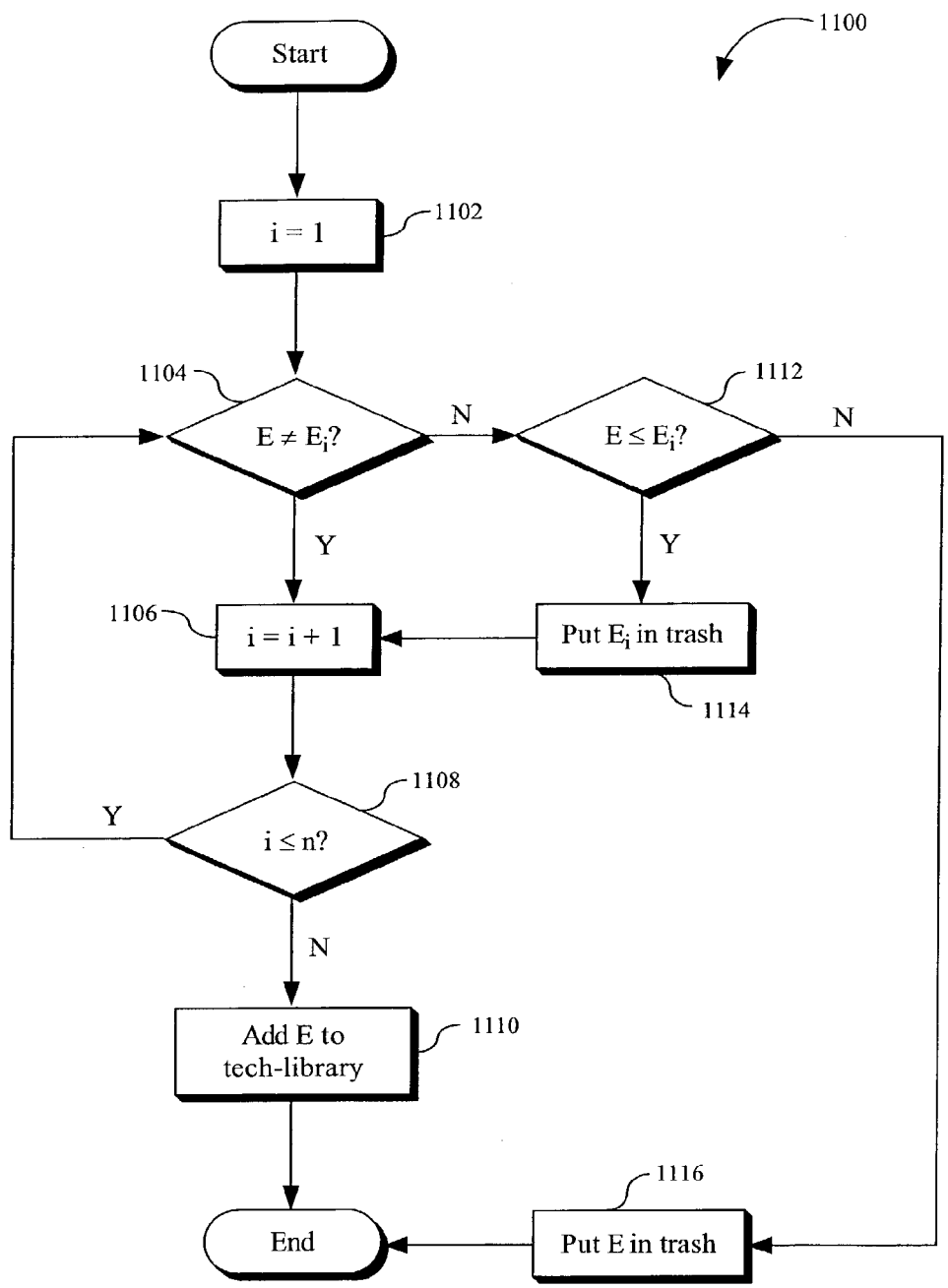
FIG. 11 shows an exemplary process for adding a newly generated tech-description to a tech-library for a logic function with a negation index in accordance with the present invention.

FIG. 11 shows an exemplary process 1100 for adding a newly generated tech-description E to a tech-library for a logic function with a negation index in accordance with the present invention. For example, E may be a tech-description e for the circuit 900 shown in FIG. 9C. The process 1100 compares E with each existing tech-description $E_i$ in the tech-library consequently over one or more marked parameters within a precision $\epsilon$ ($\epsilon$ may be 0). A tech-description may have its parameter marked as a j-th marked parameter ($j \geq 0$). In one embodiment, an area occupied by the physical circuit, iterated delay for every arc, and a maximum delay may be chosen as marked parameters since these parameters are critical for timing optimization. For example, a 0-th marked parameter may be an area, a 1-th marked parameter may be iterated delay for every arc, and a 2-th marked parameter may be a maximum delay.

The process 1100 starts with step 1102, in which i=1. In step 1104, is $E \neq E_i$? That is, are E and $E_i$ incomparable tech-descriptions? E and $E_i$ are incomparable when E has at least one marked parameter better (e.g., smaller) than that of $E_i$ and at least one marked parameter worse (e.g., bigger) than that of $E_i$ within the precision $\epsilon$ at the same time.

If $E \neq E_i$, that is, if E and $E_i$ are incomparable, then the process 1100 proceeds to step 1106, in which i=i+1. Next, in step 1108, is i≦n, where n represents the number of the existing tech-descriptions in the tech-library? If the answer is yes, the process 1100 returns to the step 1104. If the answer is no, then E is added to the tech-library in the step 1120 and the process 1100 ends.

If the answer to the inquiry of whether E and $E_i$ are incomparable in the step 1104 is no, that is, if E and $E_i$ are comparable, the process 1100 proceeds to step 1112. In the step 1112, is $E≦E_i$? That is, are all the marked parameters of the tech-description E better (e.g., smaller) than those of $E_i$ with the precision $\epsilon$? If $E≦E_i$, that is, if E has better marked parameters, the process 1100 proceeds to step 1114, in which $E_i$ is deleted or put into trash, and the process proceeds to the step 1106. If $E_i$ has better marked parameters, then the process 1100 proceeds to step 1116, in which E is deleted or put into trash, and the process 1100 ends.

As shown in FIG. 11, when E has at least one marked parameter better (e.g., smaller) than that of all existing elements in the tech-library, E is added to the tech-library. In contrast, when all marked parameters of E are worse (e.g., bigger) than those of any existing element of the tech-library, then E is not added to the tech-library.

Reducing the Number of Tech-descriptions in Tech-library

After the process 500 and the process 1200, if a created tech-library L0 for a logic function with a corresponding negation index has twice more tech-descriptions (or elements) than a limit max_numb, the number of the elements in the tech-library L0 need be reduced. It is understood that by increasing the upper bound to (2*max_numb), (max_numb−1) operations of reductions may be eliminated.

Figure 12:
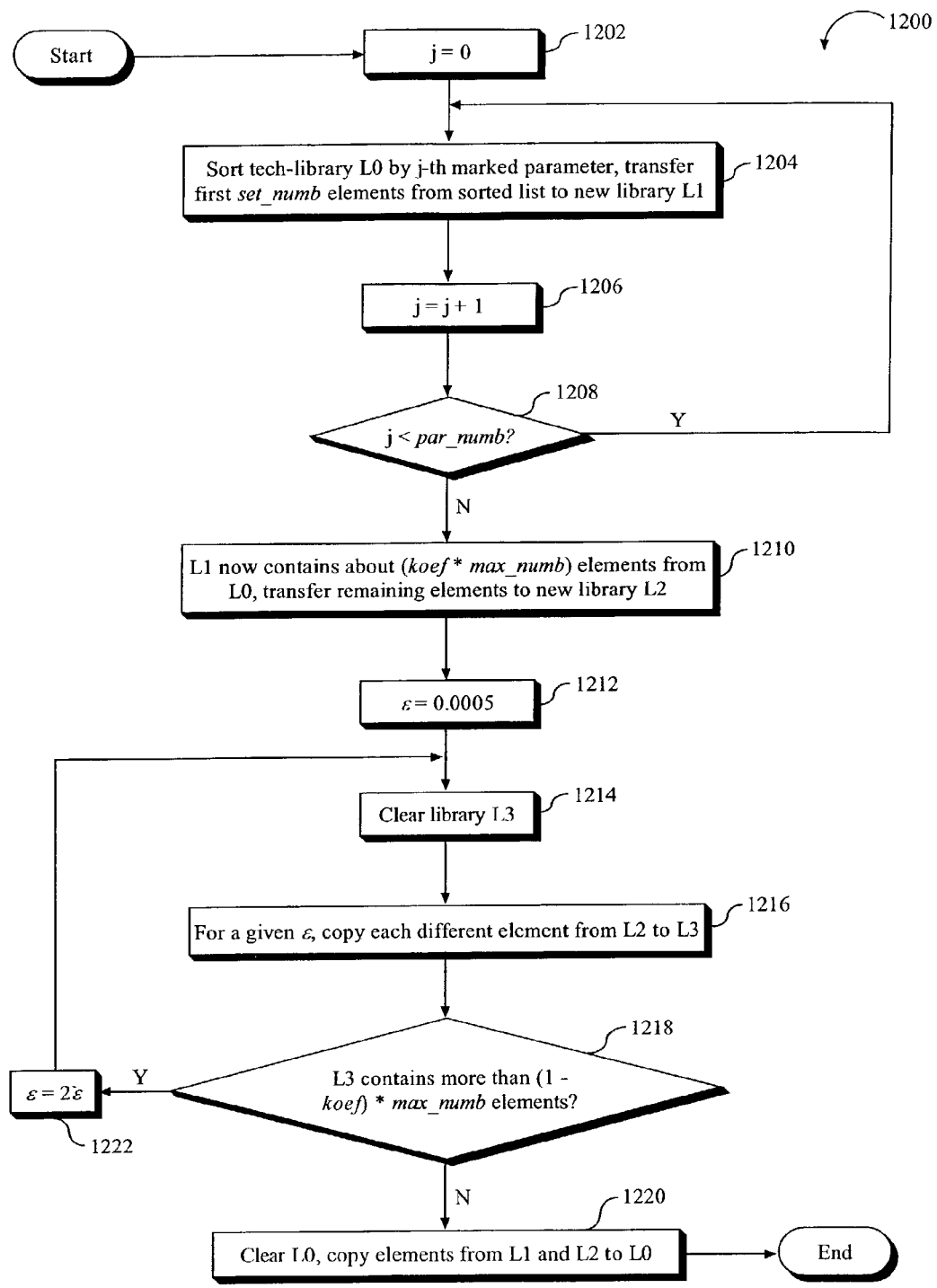
FIG. 12 shows an exemplary process for reducing the number of tech-descriptions in a tech-library for a logic function with a negation index in accordance with the present invention.

Referring to FIG. 12, an exemplary process 1200 for reducing the number of elements in the created tech-library L0 is shown. The process 1200 may be performed in the step 512 shown in FIG. 5. Each element in the tec-libaray L0 has j-th marked parameter(s). Denote real_numb as the real number of the elements in the tech-library L0, max_numb as the limit, and par_numb as the number of marked parameters of the elements in the tech-library L0.

Denote set_numb=koef*max_numb/par_numb, where 0.5<koef<1. Note if koef=1, then all elements that are not optimal for any parameters may be erased, but this does not serve the purpose well since these elements may be included in optimal solutions. So in practice, a value for koef may be chosen as, for example, 0.6<koef<0.75.

The process 1200 starts with j=0 in step 1202. That is, a 0-th marked parameter is first considered. Then, in step 1204, the elements in the tech-library L0 are sorted by the j-th marked parameter, and then a set_numb of the elements with the smallest j-th marked parameter from the sort list are transferred from the tech-library L0 to an empty new library L1.

Next, in step 1206, j is changed to j+1. Then, in step 1208, is j<par_numb? If j<par_numb, then the process 1200 returns to the step 1204. If j≧par_numb, since the library L1 already contains about (koef*max_numb) elements transferred from the library L0, in step 1210 the remaining elements in the library L0 are transferred to an empty new library L2.

Next, in step 1212, a precision $\epsilon$ may be set, e.g., $\epsilon$=0.0005. Then in step 1214 a new library L3 is cleared.

Then, in step 1216 for the precision $\epsilon$, copy each different element from L2 to L3. That is, for the precision $\epsilon$, all elements in L2 may be compared against each other to get a set of different elements. Then the set of different elements may be copied from L2 to L3. For example, there are two elements t1 and t2 in L2. For t1, cell delay is 0.001, and maximal delay is 0.001. For t2, cell delay is 0.0005, and maximum delay is 0.00125. Assume all other parameters of t1 and t2 are equal. If $\epsilon$=0, since |t1−t2|>0 (where |x| denotes an absolute value of x), then t1 and t2 are different elements for the precision $\epsilon$=0, and t1 and t2 are both copied form L2 to L3. If $\epsilon$=0.0005, since |t1−t2|≦0.0005, then t1 and t2 are the same element for the precision $\epsilon$=0.0005, and only one of t1 and t2 (e.g., t1) is copied form L2 to L3.

Next in step 1218, an inquiry is held to see if the number of elements in L3 is more than (1−koef)*max_numb. If the answer is yes, then $\epsilon$=2$\epsilon$ is set in step 1222 and the process 1200 returns to the step 1214. If the answer is no, the library L0 is cleared and all the elements are copied from L1 and L2 to L0 in step 1220, and then the process 1200 ends.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for generating a tech-library for a logic function, comprising:
   (a) categorizing a first group of tech-descriptions for primitive physical circuits into a first group of tech-libraries using negation indices;
   (b) providing logic circuits realizing different representations of a logic function in said tech-library;
   (c) decomposing each of said logic circuits into a combination of instances;
   (d) selecting a second group of tech-libraries from among said first group of tech-libraries so that each of said second group of tech-libraries corresponds to each of said instances;

(e) calculating a second group of tech-descriptions from a combination of tech-descriptions from said second group of tech-libraries, said second group of tech-descriptions describing said logic function;

(f) adding a tech-description from said second group of tech-descriptions to said tech-library for said logic function when said tech-description has at least one marked parameter smaller than that of all existing elements of said tech-library for said logic function within a first precision; and (g) reducing an actual number real_numb of elements in said tech-library for said logic function when said actual number real_numb is at least twice larger than a limit max_numb;

wherein said tech-library for said logic function is optimized over said at least one marked parameter and is used for mapping said logic function.

2. The method of claim 1, wherein said at least one marked parameter is chosen from a group consisting of an area, iterated delay for every arc, and a maximal delay.

3. The method of claim 1, wherein said step (f) further comprising:

(f1) deleting an existing tech-description from said tech-library for said logic function when said existing tech-description has marked parameters all bigger than those of said tech-description.

4. The method of claim 1, wherein said step (g) further comprising:

(g1) sorting said tech-library for said logic function by j-th marked parameter, wherein $0 \leq j \leq par\_numb$ said par_numb being an actual number of marked parameters in said tech-library for said logic function;

(g2) for each j-th marked parameter transferring a set_numb of said elements with smallest j-th marked parameter from a sort list from said tech-library for said logic function to a second library, wherein set_numb=koef*max_numb/parg_numb and wherein $0.5 < koef < 1$;

(g3) transferring remaining elements in said tech-library for said logic function to a third library;

(g4) copy each different element from said third library to a fourth library for a second precision;

(g5) clearing said tech-library for said logic function when said fourth library does not contain more than (1−koef)*max_numb elements; and (g6) copying said elements in said second library and said elements in said third library to said tech-library for said logic function.

5. The method of claim 4, wherein $0.6 < koef < 0.75$.

6. A method for generating a tech-library for a logic function having a negation index, comprising:

(a) providing logic circuits realizing different representations of a logic function in said tech-library having a negation index;

(b) decomposing each of said logic circuits into a combination of instances;

(c) selecting a group of pre-created tech-libraries so that each of said group of tech-libraries corresponds to each of said instances;

(d) calculating a group of tech-descriptions from a combination of tech-descriptions from said group of pre-created tech-libraries, said group of tech-descriptions describing said logic function;

(e) adding a tech-description from said group of tech-descriptions to said tech-library for said logic function when said tech-description has at least one marked parameter smaller than that of all existing elements of said tech-library for said logic function within a first precision; and (f) reducing an actual number real_numb of elements in said tech-library for said logic function when said actual number real_numb is at least twice larger than a limit max_numb;

wherein said tech-library for said logic function is optimized over said at least one marked parameter and is used for mapping said logic function.

7. The method of claim 6, wherein said at least one marked parameter is chosen from a group consisting of an area, iterated delay for every arc, and a maximal delay.

8. The method of claim 6, wherein said group of pre-created tech-libraries including tech-descriptions for primitive physical circuits.

9. The method of claim 6, wherein said group of pre-created tech-libraries including tech-descriptions for non-primitive physical circuits.

10. The method of claim 6, wherein said step (e) further comprising:

(e1) deleting an existing tech-description from said tech-library for said logic function when said existing tech-description has marked parameters all bigger than those of said tech-description.

11. The method of claim 6, wherein said step (f) further comprising:

(f1) sorting said tech-library for said logic function by j-th marked parameter, wherein $0 \leq j \leq par\_numb$ said par_numb being an actual number of marked parameters in said tech-library for said logic function;

(f2) for each j-th marked parameter transferring a set_numb of said elements with smallest j-th marked parameter from a sort list from said tech-library for said logic function to a second library, wherein set_numb=koef*max_numb/par_numb and wherein $0.5 < koef < 1$;

(f3) transferring remaining elements in said tech-library for said logic function to a third library;

(f4) copy each different element from said third library to a fourth library for a second precision;

(f5) clearing said tech-library for said logic function when said fourth library does not contain more than (1−koef)*max_numb elements; and (f6) copying said elements in said second library and said elements in said third library to said tech-library for said logic function.

12. The method of claim 11, wherein $0.6 < koef < 0.75$.

13. A computer-readable medium having computer-executable instructions for performing a method, said method comprising:

(a) categorizing a first group of tech-descriptions for primitive physical circuits into a first group of tech-libraries using negation indices;

(b) providing logic circuits realizing different representations of a logic function in said tech-library;

(c) decomposing each of said logic circuits into a combination of instances;

(d) selecting a second group of tech-libraries from among said first group of tech-libraries so that each of said second group of tech-libraries corresponds to each of said instances;

(e) calculating a second group of tech-descriptions from a combination of tech-descriptions from said second group of tech-libraries, said second group of tech-descriptions describing said logic function;

(f) adding a tech-description from said second group of tech-descriptions to said tech-library for said logic function when said tech-description has at least one marked parameter smaller than that of all existing elements of said tech-library for said logic function within a first precision; and (g) reducing an actual number real_numb of elements in said tech-library for said logic function when said actual number real_numb is at least twice larger than a limit max_numb; wherein said tech-library for said logic function is optimized over said at least one marked parameter and is used for mapping said logic function.

14. The computer-readable medium of claim 13, wherein said at least one marked parameter is chosen from a group consisting of an area, iterated delay for every arc, and a maximal delay.

15. The computer-readable medium of claim 13, wherein said step (f) of said method further comprising:

(f1) deleting an existing tech-description from said tech-library for said logic function when said existing tech-description has marked parameters all bigger than those of said tech-description.

16. The computer-readable medium of claim 13, wherein said step (g) of said method further comprising:

(g1) sorting said tech-library for said logic function by j-th marked parameter, wherein $0 \leq j \leq par\_numb$ said par_numb being an actual number of marked parameters in said tech-library for said logic function;

(g2) for each j-th marked parameter transferring a set_numb of said elements with smallest j-th marked parameter from a sort list from said tech-library for said logic function to a second library, wherein set_numb=koef*max_numb/par_numb and wherein $0.5 \leq koef \leq 1$;

(g3) transferring remaining elements in said tech-library for said logic function to a third library;

(g4) copy each different element from said third library to a fourth library for a second precision;

(g5) clearing said tech-library for said logic function when said fourth library does not contain more than (1−koef)*max_numb elements; and (g6) copying said elements in said second library and said elements in said third library to said tech-library for said logic function.

17. The computer-readable medium of claim 16, wherein $0.6<koef<0.75$.

18. A computer-readable medium having computer-executable instructions for performing a method, said method comprising:

(a) providing logic circuits realizing different representations of a logic function in said tech-library having a negation index;

(b) decomposing each of said logic circuits into a combination of instances;

(c) selecting a group of pre-created tech-libraries so that each of said group of tech-libraries corresponds to each of said instances;

(d) calculating a group of tech-descriptions from a combination of tech-descriptions from said group of pre-created tech-libraries, said group of tech-descriptions describing said logic function;

(e) adding a tech-description from said group of tech-descriptions to said tech-library for said logic function when said tech-description has at least one marked parameter smaller than that of all existing elements of said tech-library for said logic function within a first precision; and (f) reducing an actual number real_numb of elements in said tech-library for said logic function when said actual number real_numb is at least twice larger than a limit max_numb;

wherein said tech-library for said logic function is optimized over said at least one marked parameter and is used for mapping said logic function.

19. The computer-readable medium of claim 18, wherein said at least one marked parameter is chosen from a group consisting of an area, iterated delay for every arc, and a maximal delay.

20. The computer-readable medium of claim 18, wherein said group of pre-created tech-libraries including tech-descriptions for primitive physical circuits.

21. The computer-readable medium of claim 18, wherein said group of pre-created tech-libraries including tech-descriptions for non-primitive physical circuits.

22. The computer-readable medium of claim 18, wherein said step (e) of said method further comprising:

(e1) deleting an existing tech-description from said tech-library for said logic function when said existing tech-description has marked parameters all bigger than those of said tech-description.

23. The computer-readable medium of claim 18, wherein said step (f) of said method further comprising:

(f1) sorting said tech-library for said logic function by j-th marked parameter, wherein $0 \leq j \leq par\_numb$ said par_numb being an actual number of marked parameters in said tech-library for said logic function;

(f2) for each j-th marked parameter transferring a set_numb of said elements with smallest j-th marked parameter from a sort list from said tech-library for said logic function to a second library, wherein set_numb=koef*max_numb/par_numb and wherein $0.5<koef<1$;

(f3) transferring remaining elements in said tech-library for said logic function to a third library;

(f4) copy each different element from said third library to a fourth library for a second precision;

(f5) clearing said tech-library for said logic function when said fourth library does not contain more than (1−koef)*max_numb elements; and (f6) copying said elements in said second library and said elements in said third library to said tech-library for said logic function.

24. The computer-readable medium of claim 23, wherein $0.6<koef<0.75$.

* * * * *